(12) United States Patent
Bang et al.

(10) Patent No.: US 10,483,335 B2
(45) Date of Patent: Nov. 19, 2019

(54) ORGANIC LIGHT EMITTING DISPLAY DEVICE HAVING PIXEL DEFINING LAYER

(71) Applicant: LG Display Co., Ltd., Seoul (KR)

(72) Inventors: Hyungseok Bang, Goyang-si (KR); JongGeun Yoon, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/854,112

(22) Filed: Dec. 26, 2017

(65) Prior Publication Data
US 2018/0190740 A1 Jul. 5, 2018

(30) Foreign Application Priority Data

Dec. 30, 2016 (KR) .......................... 10-2016-0183644

(51) Int. Cl.
| | |
|---|---|
| *H01L 27/32* | (2006.01) |
| *H01L 51/50* | (2006.01) |
| *H01L 51/52* | (2006.01) |
| *H01L 51/56* | (2006.01) |
| *H01L 27/12* | (2006.01) |

(52) U.S. Cl.
CPC ........ *H01L 27/3246* (2013.01); *H01L 27/322* (2013.01); *H01L 51/504* (2013.01); *H01L 51/5234* (2013.01); *H01L 51/5253* (2013.01); *H01L 51/5271* (2013.01); *H01L 51/56* (2013.01); *H01L 27/1248* (2013.01); *H01L 27/3211* (2013.01); *H01L 27/3258* (2013.01); *H01L 27/3276* (2013.01); *H01L 2227/323* (2013.01)

(58) Field of Classification Search
CPC .................................................. H01L 27/3246
USPC ..................................................... 257/40, 59
See application file for complete search history.

(56) References Cited

U.S. PATENT DOCUMENTS

| | | | |
|---|---|---|---|
| 2006/0170340 A1* | 8/2006 | Tzen ...................... | H01L 27/322 313/506 |
| 2009/0009069 A1* | 1/2009 | Takata ................. | H01L 27/3246 313/504 |
| 2009/0278450 A1 | 11/2009 | Sonoyama et al. | |
| 2012/0228603 A1* | 9/2012 | Nakamura ............. | H01L 27/322 257/40 |
| 2014/0203271 A1* | 7/2014 | Yoneda ............... | H01L 51/5265 257/40 |
| 2014/0239272 A1 | 8/2014 | Kim | |
| 2014/0353630 A1* | 12/2014 | Baek ...................... | H01L 51/525 257/40 |
| 2015/0084026 A1* | 3/2015 | Miyamoto .......... | H01L 51/5275 257/40 |

(Continued)

FOREIGN PATENT DOCUMENTS

KR  10-2014-0141372 A  12/2014

*Primary Examiner* — Lex H Malsawma
*Assistant Examiner* — Eric W Jones
(74) *Attorney, Agent, or Firm* — Morgan, Lewis & Bockius LLP

(57) ABSTRACT

An organic light emitting display device includes a first electrode in an emission area of a subpixel; a pixel defining layer surrounding the first electrode in a non-emissive area of the subpixel; a light emitting layer on the first electrode; a second electrode on the light emitting layer; a first encapsulation layer on the second electrode; and a color filter on the first encapsulation layer in the subpixel.

22 Claims, 12 Drawing Sheets

(56) References Cited

U.S. PATENT DOCUMENTS

| | | | |
|---|---|---|---|
| 2015/0243704 A1* | 8/2015 | Lee | H01L 51/56 |
| | | | 257/79 |
| 2015/0349291 A1* | 12/2015 | Song | H01L 27/3211 |
| | | | 257/40 |
| 2015/0357388 A1* | 12/2015 | Pang | H01L 27/3223 |
| | | | 257/40 |
| 2016/0118450 A1* | 4/2016 | Lee | H01L 51/001 |
| | | | 257/40 |
| 2016/0372528 A1* | 12/2016 | Kamura | H01L 51/0096 |
| 2017/0288174 A1 | 10/2017 | Ueda | |

* cited by examiner

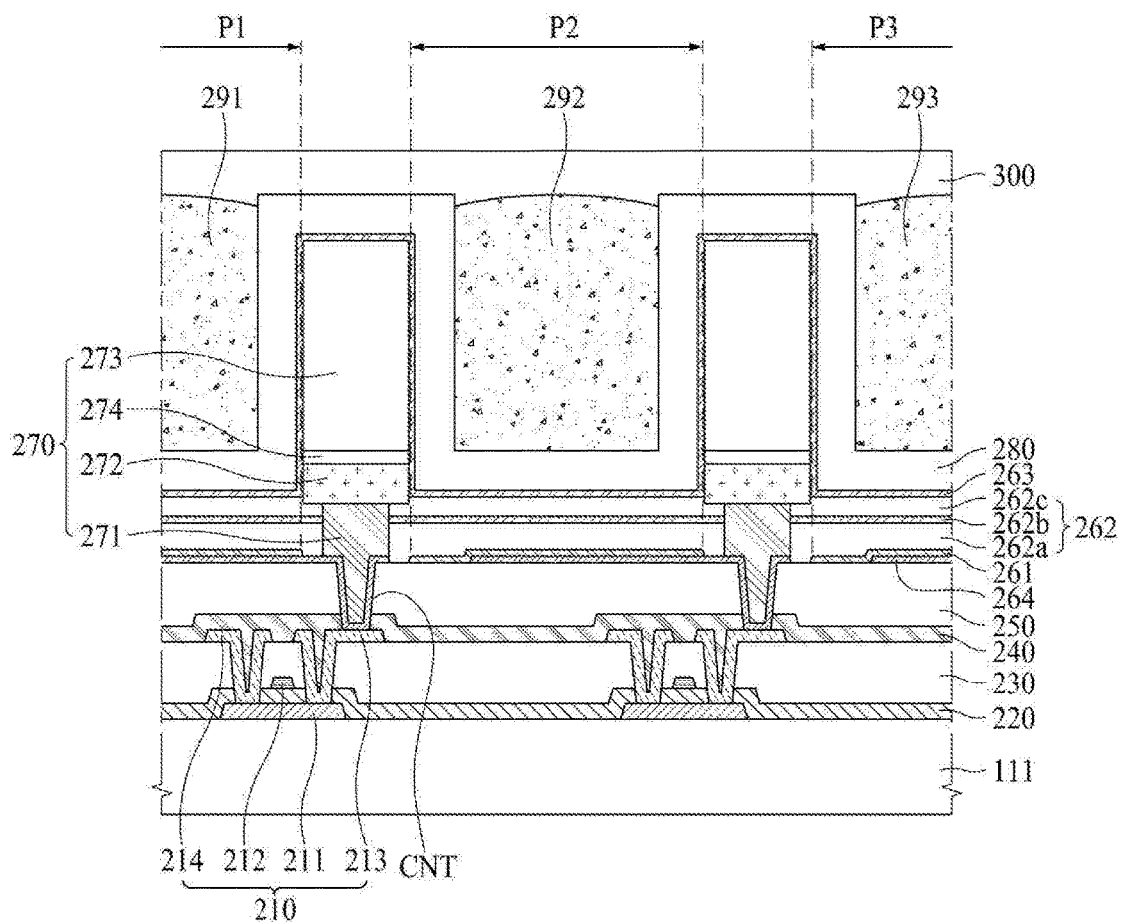

ORGANIC LIGHT EMITTING DISPLAY DEVICE HAVING PIXEL DEFINING LAYER

CROSS-REFERENCE TO RELATED APPLICATIONS

This application claims the benefit of Korean Patent Application No. 10-2016-0183644 filed on Dec. 30, 2016, which is hereby incorporated by reference as if fully set forth herein.

BACKGROUND

Technical Field

The present disclosure relates to an organic light emitting display device.

Discussion of the Related Art

With the advancement of an information-oriented society, various requirements for display devices for displaying an image are increasing. Therefore, various display devices, such as liquid crystal display (LCD) devices, plasma display panel (PDP) devices, organic light emitting display devices, etc., have recently been used.

As a type of display device, organic light emitting display devices are self-emitting display devices and are better in viewing angle and contrast ratio than LCD devices. Also, because the organic light emitting display devices do not need a separate backlight, the organic light emitting display devices can be made lighter and thinner. Furthermore, organic light emitting display devices are driven with a low direct current (DC) voltage, have low power consumption, have a fast response time, and are low in manufacturing cost.

Typically, an organic light emitting display device includes anode electrodes, a bank that divides the anode electrodes, a hole transporting layer, an organic light emitting layer, and an electron transporting layer that are formed on the anode electrodes, and a cathode electrode formed on the electron transporting layer. In this case, when a high-level voltage is applied to the anode electrode and a low-level voltage is applied to the cathode electrode, a hole and an electron respectively move to the organic light emitting layer through the hole transporting layer and the electron transporting layer and are combined with each other in the organic light emitting layer to emit light.

In organic light emitting display devices, an area where an anode electrode, an organic light emitting layer, and a cathode electrode are sequentially stacked may be an emissive area that emits light, and an area where a bank is provided may be a non-emissive area that does not emit light. That is, the emissive area may be defined as a pixel, and in this case, the bank may act as a pixel defining layer to define the pixel.

The pixel may include a red subpixel, a green subpixel, and a blue subpixel. In this case, each of the red subpixel, the green subpixel, and the blue subpixel may include a white organic light emitting layer, which emits white light. The red subpixel may be disposed in correspondence with a red color filter for realizing red light, the green subpixel may be disposed in correspondence with a green color filter for realizing green light, and the blue subpixel may be disposed in correspondence with a blue color filter for realizing blue light.

Alternatively, the red subpixel may include a red organic light emitting layer to emit red light, the green subpixel may include a green organic light emitting layer to emit green light, and the blue subpixel may include a blue organic light emitting layer to emit blue light. In this case, the red subpixel, the green subpixel, and the blue subpixel may respectively realize red, green, and blue light without color filters. Nevertheless, a red color filter corresponding to the red subpixel, a green color filter corresponding to the green subpixel, and a blue color filter corresponding to the blue subpixel may be provided for decreasing reflection of external light or correcting color coordinates.

Light from one subpixel may be output through a color filter corresponding to the one subpixel. However, if light from one subpixel is output through a color filter corresponding to a subpixel adjacent to the one subpixel, color mixing (color mixture) can occur. For example, if light from the red subpixel is output through the green color filter corresponding to the green subpixel adjacent to the red subpixel, color mixing can occur. Each of the subpixels may not realize desired brightness due to color mixing. As such, a user may notice degradation in image quality.

SUMMARY

Accordingly, embodiments of the present disclosure are directed to an organic light emitting display device that substantially obviates one or more of the problems due to limitations and disadvantages of the related art An aspect of the present disclosure is to provide an organic light emitting display device for reducing or preventing the occurrence of color mixing.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an organic light emitting display device comprises a first electrode of a subpixel; a pixel defining layer surrounding the first electrode in a non-emissive area of the subpixel; a light emitting layer on the first electrode; a second electrode on the light emitting layer; a first encapsulation layer on the second electrode; and a color filter on the first encapsulation layer in the subpixel.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings:

FIG. 7 is a cross-sectional view illustrating another example taken along line I-I' of FIG. 3;

DETAILED DESCRIPTION

Figure 1:
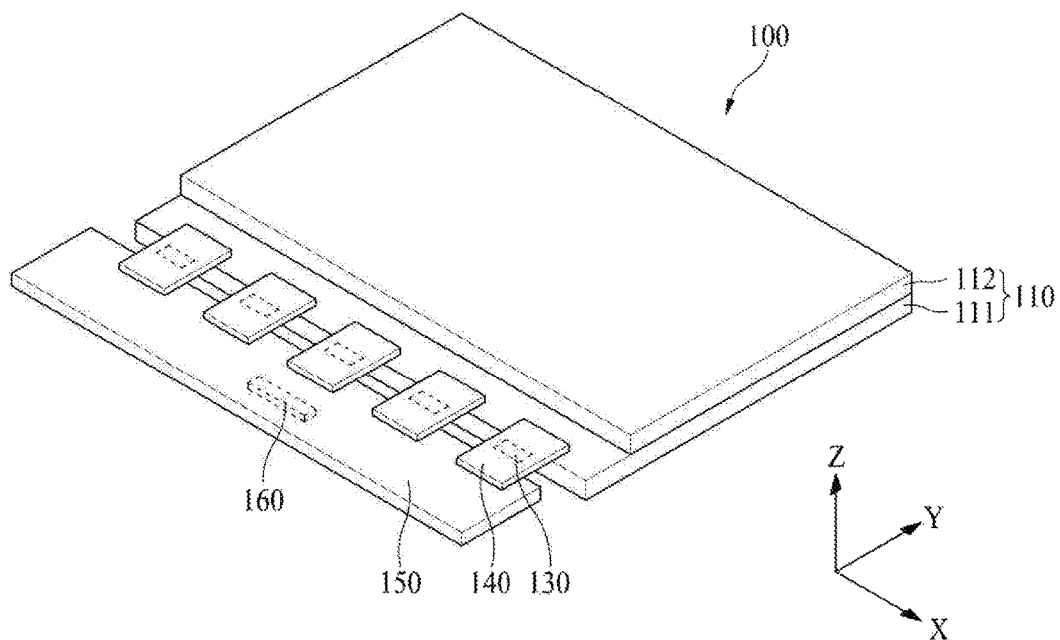
FIG. 1 is a perspective view illustrating an organic light emitting display device according to an example embodiment of the present disclosure.

Reference will now be made in detail to embodiments of the present disclosure, examples of which are illustrated in the accompanying drawings. Wherever possible, the same reference numbers will be used throughout the drawings to refer to the same or like parts.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where "comprise," "have," and "include" described in the present specification are used, another part may be added unless "only~" is used. The terms of a singular form may include plural forms unless referred to the contrary.

In construing an element, the element is construed as including an error range although there is no explicit description.

In describing a position relationship, for example, when a position relation between two parts is described as "on~," "over~," "under~," and "next~," one or more other parts may be disposed between the two parts unless 'just' or 'direct' is used.

In describing a time relationship, for example, when the temporal order is described as "after~," "subsequent~," "next~," and "before~," a case which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, example embodiments of the present disclosure will be described in detail with reference to the accompanying drawings.

Figure 2:
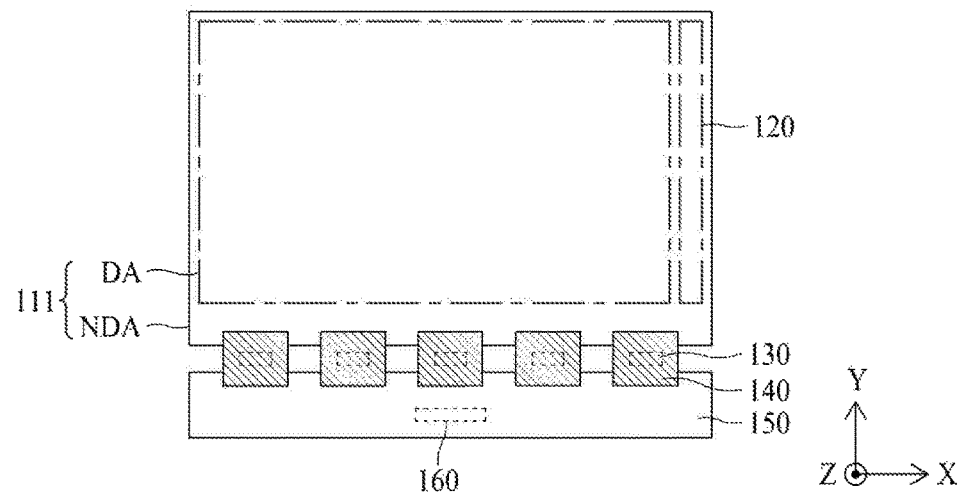
FIG. 2 is a plan view illustrating a first substrate, a gate driver, a source drive integrated circuit (IC), a flexible film, a circuit board, and a timing controller of FIG. 1.

FIG. 1 is a perspective view illustrating an organic light emitting display device 100 according to an example embodiment of the present disclosure. FIG. 2 is a plan view illustrating a first substrate, a gate driver, a source drive integrated circuit (IC), a flexible film, a circuit board, and a timing controller of FIG. 1.

With reference to FIGS. 1 and 2, the organic light emitting display device 100 according to an example embodiment of the present disclosure may include a display panel 110, a gate driver 120, a source drive IC 130, a flexible film 140, a circuit board 150, and a timing controller 160. The display panel 110 may include a first substrate 111 and a second substrate 112. The second substrate 112 may be an encapsulation substrate. The first substrate 111 may be a plastic film, a glass substrate, or the like. The second substrate 112 may be a plastic film, a glass substrate, an encapsulation film, or the like. In an example embodiment of the present disclosure, the second substrate 112 may be omitted.

A plurality of gate lines, a plurality of data lines, and a plurality of pixels may be provided on one surface of the first substrate 111 facing the second substrate 112. The pixels may be respectively provided in a plurality of areas defined by an intersection structure of the gate lines and the data lines.

Each of the pixels may include a thin film transistor (TFT) and an organic light emitting device having a first electrode, an organic light emitting layer, and a second electrode. When a gate signal is input through a gate line, each of the pixels may supply a certain current to the organic light emitting device using the TFT according to a data voltage supplied through a data line. Therefore, the organic light emitting device of each of the pixels may emit light having certain brightness according to the certain current.

The display panel 110, as illustrated in FIG. 2, may be divided into a display area DA, where the pixels are provided to display an image, and a non-display area NDA that does not display an image. The gate lines, the data lines, and the pixels may be provided in the display area DA. The gate driver 120 and a plurality of pads may be provided in the non-display area NDA.

The gate driver 120 may sequentially supply gate signals to the gate lines according to a gate control signal input from the timing controller 160. The gate driver 120 may be provided in the non-display area NDA outside one side or both sides of the display area DA of the display panel 110 in a gate driver-in panel (GIP) type. Alternatively, the gate driver 120 may be manufactured as a driving chip and may be mounted on a flexible film, and moreover, may be attached on the non-display area NDA outside the one side or the both sides of the display area DA of the display panel 110 in a tape automated bonding (TAB) type.

The source driver IC 130 may receive digital video data and a source control signal from the timing controller 160. The source driver IC 130 may convert the digital video data into analog data voltages according to the source control signal and may respectively supply the analog data voltages to the data lines. If the source drive IC 130 is manufactured as a driving chip, the source drive IC 130 may be mounted on the flexible film 140 in a chip-on film (COF) type or a chip-on-plastic (COP) type.

A plurality of pads, such as data pads, may be provided in the non-display area NDA of the display panel 110. Lines connecting the pads to the source drive IC 130 and lines connecting the pads to lines of the circuit board 150 may be provided on the flexible film 140. The flexible film 140 may be attached on the pads using an anisotropic conductive film. Thus, the pads may be connected to the lines of the flexible film 140.

The circuit board 150 may be attached on the flexible film 140, which is provided in plurality. A plurality of circuits implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board (not shown) through a cable of the circuit board 150. The timing controller 160 may generate a gate control signal for controlling an operation timing of the gate driver 120 and a source control signal for controlling the source drive IC 130 that is provided in plurality, based on the timing signal. The timing controller 160 may supply the gate control signal to the gate driver 120, and may supply the source control signal to the plurality of source drive ICs 130.

Figure 3:
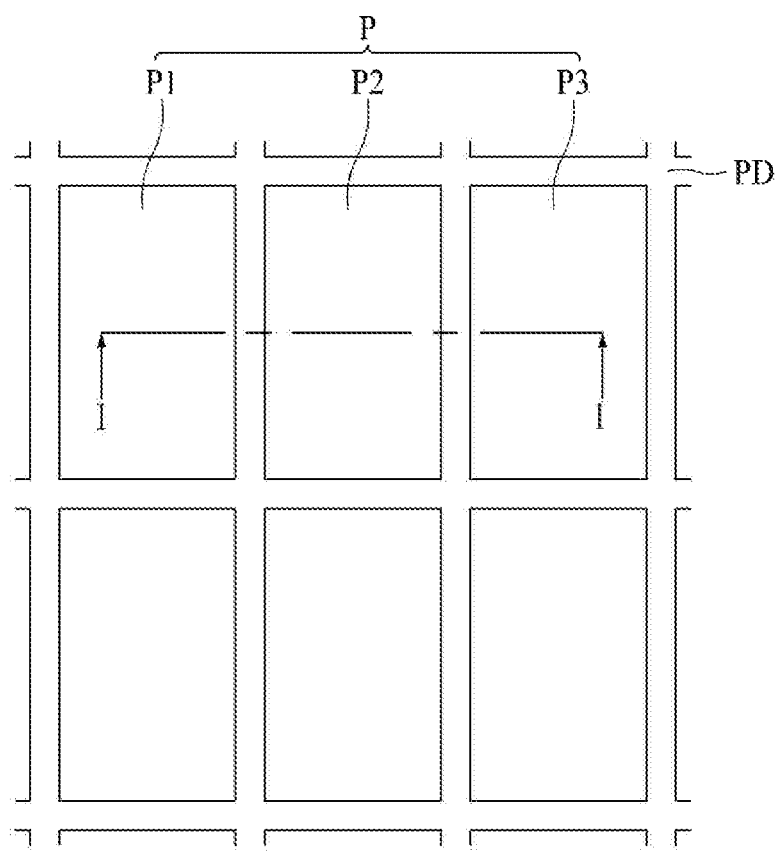
FIG. 3 is a plan view illustrating subpixels in a display area.

FIG. 3 is a plan view illustrating subpixels in a display area. In FIG. 3, for convenience of description, only first to third subpixels P1 to P3 and a pixel defining layer PD are illustrated.

With reference to FIG. 3, each of the pixels P may include the first to third subpixels P1 to P3. Each of the first to third subpixels P1 to P3 may denote an area where a first electrode corresponding to an anode electrode, an organic light emitting layer, and a second electrode corresponding to a cathode electrode are sequentially stacked, and a hole from the first electrode and an electron from the second electrode are combined with each other to emit light in the organic light emitting layer. The first to third subpixels P1 to P3 may be defined by the pixel defining layer PD.

In an example embodiment of the present disclosure, the organic light emitting layer may be provided as a common layer in the first to third subpixels P1 to P3 to emit white light. Therefore, a plurality of color filters are needed so that the first subpixel P1 emits light of a first color, the second subpixel P2 emits light of a second color, and the third subpixel P3 emits light of a third color. For example, a first color filter may be disposed in correspondence with the first subpixel P1, a second color filter may be disposed in correspondence with the second subpixel P2, and a third color filter may be disposed in correspondence with the third subpixel P3. In this case, the light of the first color may be red light, the first color filter may be a red color filter, the light of the second color may be green light, the second color filter may be a green color filter, the light of the third color may be blue light, and the third color filter may be a blue color filter. However, embodiments of the present disclosure are not limited thereto.

Figure 4:
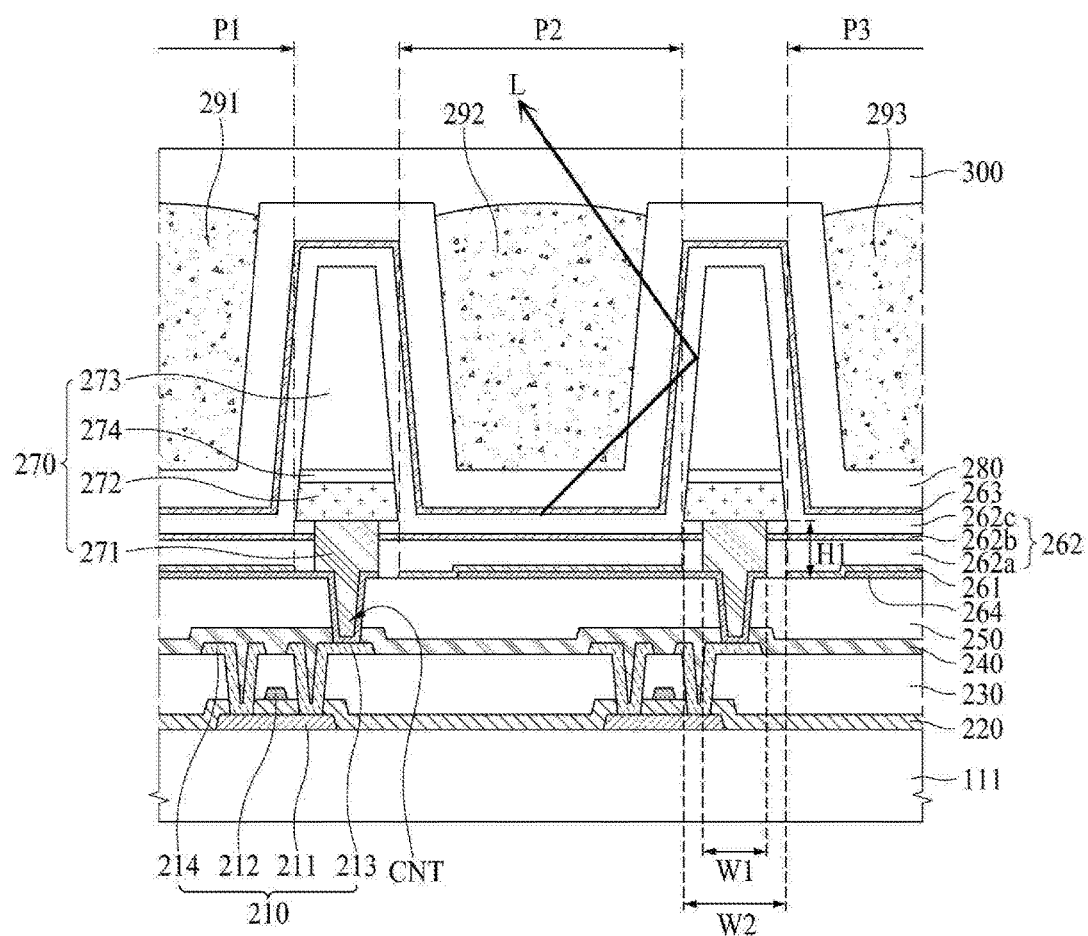
FIG. 4 is a cross-sectional view illustrating an example taken along line I-I' of FIG. 3.

FIG. 4 is a cross-sectional view illustrating an example taken along line I-I' of FIG. 3.

With reference to FIG. 4, a plurality of TFTs 210 may be formed on a first substrate 111. Before forming the TFTs 210, a buffer layer may be formed on the first substrate 111. The buffer layer may be formed on the first substrate 111, for protecting the TFTs 210 from water penetrating through the first substrate 111 vulnerable to penetration of water. The buffer layer may include a plurality of inorganic layers that are alternately stacked. For example, the buffer layer may be formed of a multilayer where one or more inorganic layers of silicon oxide (SiOx), silicon nitride (SiNx), and SiON are alternately stacked. The buffer layer may be omitted.

The TFTs 210 may be formed on the buffer layer. Each of the TFTs 210 may include an active layer 211, a gate electrode 212, a source electrode 213, and a drain electrode 214. In FIG. 4, the TFTs 210 are illustrated by example as being formed as a top gate type where the gate electrode 212 is disposed on the active layer 211, but embodiments are not limited thereto. In other embodiments, the TFTs 210 may be formed as a bottom gate type where the gate electrode 212 is disposed under the active layer 211 or a double gate type where the gate electrode 212 is disposed both on and under the active layer 211.

The active layer 211 may be formed on the buffer layer. The active layer 211 may be formed of a silicon-based semiconductor material or an oxide-based semiconductor material. A light blocking layer for blocking external light incident on the active layer 211 may be formed between the buffer layer and the active layer 211.

A gate insulation layer 220 may be formed on the active layer 211. The gate insulation layer 220 may be formed of an inorganic layer, for example, silicon oxide (SiOx), silicon nitride (SiNx), or a multilayer thereof.

The gate electrode 212 and a gate line may be formed on the gate insulation layer 220. The gate electrode 212 and the gate line may each be formed of a single layer or a multilayer including one of molybdenum (Mo), aluminum (Al), chromium (Cr), titanium (Ti), nickel (Ni), neodymium (Nd), copper (Cu), or an alloy of one or more thereof.

An interlayer dielectric 230 may be formed on the gate electrode 212 and the gate line. The interlayer dielectric 230 may be formed of an inorganic layer, for example, SiOx, SiNx, or a multilayer thereof.

The source electrode 213, the drain electrode 214, and a data line may be formed on the interlayer dielectric 230. The source electrode 213 may contact the active layer 211 through a contact hole passing through the gate insulation layer 220 and the interlayer dielectric 230. The drain electrode 214 may contact the active layer 211 through a contact hole passing through the gate insulation layer 220 and the interlayer dielectric 230. The source electrode 213, the drain electrode 214, and the data line may each be formed of a single layer or a multilayer that includes one of Mo, Al, Cr, Ti, Ni, Nd, Cu, or an alloy of one or more thereof.

A passivation layer 240 for insulating the TFTs 210 may be formed on the source electrode 213, the drain electrode 214, and the data line. The passivation layer 240 may be formed of an inorganic layer, for example, SiOx, SiNx, or a multilayer thereof.

A planarization layer 250 for planarizing a step height caused by the TFTs 210 may be formed on the passivation layer 240. The passivation layer 250 may be formed of an organic layer, such as acryl resin, epoxy resin, phenolic resin, polyamide resin, polyimide resin, and/or the like.

An auxiliary electrode 264, an organic light emitting device, and a pixel defining layer 270 may be formed on the planarization layer 250. The organic light emitting device may include a first electrode 261, a light emitting layer 262, and a second electrode 263. The first electrode 261 may be an anode electrode, and the second electrode 263 may be a cathode electrode. The pixel defining layer 270 may include first to third pixel defining layers 271 to 273.

The auxiliary electrode 264 may be formed on the planarization layer 250. The auxiliary electrode 264 may be connected to the source electrode 213 or the drain electrode 214 of the TFT 210 through a contact hole CNT passing through the passivation layer 240 and the planarization layer 250 to expose the drain electrode 214 of the TFT 210. A first pixel defining layer 271 may be formed on the auxiliary electrode 264 in the contact hole CNT. If a step height of the contact hole CNT is exposed without being covered by the first pixel defining layer 271, the light emitting layer 262 may be non-uniformly formed in the contact hole CNT, and for this reason, the auxiliary electrode 264 can be short-circuited with the second electrode 263 or a charge generation layer 262c of the light emitting layer 262. Therefore, the contact hole CNT may be filled by the first pixel defining layer 271, thereby preventing the auxiliary electrode 264 from being short-circuited with the second electrode 263 or the charge generation layer 262c of the light emitting layer 262.

The auxiliary electrode 264 may be formed of a transparent conductive material, a semi-transmissive conductive material, or an opaque conductive material. The transparent conductive material may be a transparent conductive material (TCO), such as indium tin oxide (ITO) or indium zinc oxide (IZO). The semi-transmissive conductive material may be magnesium (Mg), silver (Ag), or an alloy of Mg and Ag. The opaque conductive material may be aluminum (Al), molybdenum (Mo), a stacked structure (Mo/Ti) of Mo and titanium (Ti), copper (Cu), or a stacked structure (Ti/Al/Ti) of Al and Ti.

The first electrode 261 may be formed on the auxiliary electrode 264 without being covered by the first pixel defining layer 271. An area where the first electrode 261 is provided may be defined as a subpixel. The first electrode 261 may include a first metal layer of a metal material with high reflectivity, such as Al, Ag, or an APC alloy, and a second metal layer of a transparent conductive material (TCO), such as ITO or IZO. Because the first electrode 261 includes the first metal layer that is high in reflectivity, light of the light emitting layer 262 traveling in a direction toward the first electrode 261 may be reflected in a direction toward the second electrode 263. That is, in an example embodiment of the present disclosure, the display device may be implemented as a top emission type.

The pixel defining layer 270 may be formed in the contact hole CNT. The pixel defining layer 270 functions to divide the subpixels P1 to P3. That is, the pixel defining layer 270 may define the subpixels P1 to P3. Also, an area where the pixel defining layer 270 is provided does not emit light, and thus, may be defined as a non-emissive area. The pixel defining layer 270 surrounds the first electrode 261.

The pixel defining layer 270 may include the first to third pixel defining layers 271 to 273 and a first metal layer 274. The first pixel defining layer 271 may be disposed in the contact hole CNT, the second pixel defining layer 272 may be disposed on the first pixel defining layer 271, the first metal layer 274 may be disposed on the second pixel defining layer 272, and the third pixel defining layer 273 may be disposed on the second pixel defining layer 272. The first metal layer 274 may be disposed between the second pixel defining layer 272 and the third pixel defining layer 273.

A width W2 of the second pixel defining layer 272 may be set wider than a width W1 of the first pixel defining layer 271. That is, the pixel defining layer 270 may have a mushroom structure in which an upper portion is wider than a lower portion.

Moreover, the second pixel defining layer 272, the first metal layer 274, and the third pixel defining layer 273 may be formed in a taper structure. The taper structure may denote a structure where an angle between a bottom and a side is 0 degrees to 90 degrees. For example, a cross-sectional surface of each of the second pixel defining layer 272, the first metal layer 274, and the third pixel defining layer 273 may be formed in a trapezoid shape as shown in FIG. 4.

When the second pixel defining layer 272, the first metal layer 274, and the third pixel defining layer 273 are formed in the taper structure, the organic light emitting layer 262 may be formed on a side surface of each of the second pixel defining layer 272, the first metal layer 274, and the third pixel defining layer 273. Thus, the first metal layer 274 may not be connected to the second electrode 263. In this case, any voltage may not be applied to the first metal layer 274. Alternatively, the first metal layer 274 may be connected to the second electrode 263 in a non-display area, and in this case, the same voltage as a voltage applied to the second electrode 263 may be applied to the first metal layer 274.

The first to third pixel defining layers 271 to 273 may be formed of the same material. Alternatively, at least one of the first to third pixel defining layers 271 to 273 may be formed of a material different from that of each of the other pixel defining layers. The first to third pixel defining layers 271 to 273 may each be formed of an organic layer or an inorganic layer.

In the related art, because the pixel defining layer 270 covers an edge of the first electrode 261, a size of each of the subpixels P1 to P3 is reduced due to the pixel defining layer 270. However, in an example embodiment of the present disclosure, because the pixel defining layer 270 does not cover the edge of the first electrode 261, there is no area that is lost due to the pixel defining layer 270 in each of the subpixels P1 to P3. Accordingly, in an example embodiment of the present disclosure, the size of each of the subpixels P1 to P3 is maximized.

The light emitting layer 262 may be formed on the first electrode 261. The light emitting layer 262 may be a common layer that is formed in the first to third subpixels P1 to P3 in common, and may be a white light emitting layer that emits white light. In this case, the light emitting layer 262 may be formed in a tandem structure including two or more light emitting layers (or stacks). The light emitting layer 262, as shown in FIG. 4, may include a first light emitting layer 262a, a second light emitting layer 262c, and a charge generation layer 262b disposed between the first light emitting layer 262a and the second light emitting layer 262c. For example, to emit white light using a combination of the first light emitting layer 262a and the second light emitting layer 262c, the first light emitting layer 262a may include an organic light emitting layer that emits yellow light, and the second light emitting layer 262c may include an organic light emitting layer that emits blue light. However, embodiment of the present disclosure are not limited thereto.

Each of the first and second light emitting layers 262a and 262c may include a hole transporting layer, at least one light emitting layer, and an electron transporting layer. The hole transporting layer may smoothly transfer a hole, injected from the first electrode 261 or the charge generation layer, to the light emitting layer. The at least one light emitting layer may be formed of an organic material including a phosphorescent material or a fluorescent material, and thus, may emit a particular light. The electron transporting layer may smoothly transfer an electron, injected from the second electrode 263 or the charge generation layer, to the light emitting layer.

The charge generation layer 262b may include an n-type charge generation layer, disposed adjacent to a lower stack, and a p-type charge generation layer that is formed on the n-type charge generation layer and is disposed adjacent to an upper stack. The n-type charge generation layer may inject an electron into the lower stack, and the p-type charge generation layer may inject a hole into the upper stack. The n-type charge generation layer may be formed of an organic layer doped with an alkali metal, such as lithium (Li), sodium (Na), potassium (K), or cesium (Cs), or an alkaline earth metal, such as magnesium (Mg), strontium (Sr), barium (Ba), or radium (Ra). The p-type charge generation layer may be formed by doping a dopant on an organic material having an ability to transport holes.

Embodiments of the present disclosure are not limited to the light emitting layer 262 being provided as a common layer in the subpixels P1 to P3. In other example embodiments, the light emitting layer 262 may include a first organic light emitting layer that emits light of a first color in the first subpixel P1, a second organic light emitting layer that emits light of a second color in the second subpixel P2, and a third organic light emitting layer that emits light of a third color in the third subpixel P3. In this case, color filters may be omitted.

The light emitting layer 262 may be formed to cover the third pixel defining layer 273. The light emitting layer 262 may be formed in a deposition process or a solution process, and in a case of being formed in the deposition process, the light emitting layer 262 may be formed in an evaporation deposition process. A layer formed in the evaporation deposition process is not good in step coverage characteristic. The step coverage denotes that a layer deposited by a deposition process is continuously connected without being disconnected, even in a stepped area. Therefore, a thickness of the light emitting layer 262 formed on a side surface of the pixel defining layer 270 may be thinner than that of the light emitting layer 262 formed on the first electrode 261.

Moreover, the charge generation layer 262b of the light emitting layer 262 may be disposed lower than a height H1 of the first pixel defining layer 271. The charge generation layer 262b formed on the first electrode 261 may be disconnected from the charge generation layer 262b formed on each of side surfaces of the second pixel defining layer 272. If the light emitting layer 262 is formed in the subpixels P1 to P3 in common, a current of one pixel can be leaked to an adjacent pixel through the charge generation layer 262b of the light emitting layer 262. However, according to an example embodiment of the present disclosure, the charge generation layer 262b of the light emitting layer 262 may be disposed lower than the height H1 of the first pixel defining layer 271. In an example embodiment of the present disclosure, because a width W2 of the second pixel defining layer 272 is set wider than a width W1 of the first pixel defining layer 271, the charge generation layer 262b of the light emitting layer 262 may be disconnectedly provided in a boundary between the first pixel defining layer 271 and the second pixel defining layer 272. Accordingly, in an example embodiment of the present disclosure, an adjacent pixel is prevented from being affected by a leakage current leaked through the charge generation layer 262b of the organic light emitting layer 262. Also, in an area other than the first electrode 261, the light emitting layer 262 is prevented from emitting light due to a leakage of a current.

The second electrode 263 may be formed on the light emitting layer 262. The second electrode 263 may be a common layer formed in the subpixels P1 to P3 in common.

The second electrode 263 may be formed through a physical vapor deposition (PVD) process, such as a sputtering process. A layer formed in the PVD process, such as the sputtering process has good step coverage characteristics. Therefore, the second electrode 263 may be formed to cover the third pixel defining layer 273. A capping layer may be formed on the second electrode 263.

The second electrode 263 may be formed of a transparent conductive material (TCO) such as ITO or IZO. In this case, a height of the third pixel defining layer 273 may be set higher than that of each of the first pixel defining layer 271, the second pixel defining layer 272, and the first metal layer 274. Also, a refractive index of each of the first to third pixel defining layers 271 to 273 may be set lower than a refractive index of the light emitting layer 261, a refractive index of the second electrode 263, a refractive index of the first encapsulation layer 280, and a refractive index of a color filter. When light emitted from the light emitting layer 262 is incident on the third pixel defining layer 273 at an angle greater than a threshold angle, the light may be totally reflected by the third pixel defining layer 273. Accordingly, in an example embodiment of the present disclosure, the occurrence of color mixing is reduced. That is, the pixel defining layer 270 may act as a light separation wall for separating lights emitted from the subpixels P1 to P3.

In this case, each of the first to third pixel defining layers 271 to 273 may be formed of a material having a refractive index of 1.5× or less. For example, each of the first to third pixel defining layers 271 to 273 may be formed of siloxane having a refractive index of 1.3× to 1.5×, acryl having a refractive index of 1.4× to 1.5×, epoxy having a refractive index of 1.4×, or fluoride having a refractive index of 1.3×. Alternatively, by injecting an air bubble, a low refractive medium layer 294 may be formed of siloxane, acryl, epoxy, or fluoride that includes a hollow particle.

Alternatively, the second electrode 263 may be formed of a semi-transmissive conductive material such as Mg, Ag, or an alloy of Mg and Ag. The semi-transmissive conductive material may transmit some of light and may reflect the other light. Therefore, some of light emitted from the light emitting layer 262 may be reflected by the second electrode 263 provided on a side surface of the third pixel defining layer 273. Accordingly, in an example embodiment of the present disclosure, color mixing is reduced. That is, due to the second electrode 263, the pixel defining layer 270 may act as a light separation wall for separating lights emitted from the subpixels P1 to P3.

Moreover, the first electrode 261 may include a first metal layer with high reflectivity, and thus, if the second electrode 263 is formed of a semi-transmissive conductive material, the light emitted from the light emitting layer 262 may resonate between the first electrode 261 and the second electrode 263, thereby obtaining a micro-cavity effect.

Moreover, light L reflected by the third pixel defining layer 273 or the second electrode 263 may be output to the outside through a color filter. Thus, the loss of the light emitted from the light emitting layer 262 is reduced. That is, according to an example embodiment of the present disclosure, emission efficiency increases.

A first encapsulation layer 280 may be formed on the second electrode 263. The first encapsulation layer 280 reduces or prevents oxygen or water from penetrating into the light emitting layer 260 and the second electrode 263. The first encapsulation layer 280 may include at least one inorganic layer. The inorganic layer may be formed of silicon nitride, aluminum nitride, zirconium nitride, titanium nitride, hafnium nitride, tantalum nitride, silicon oxide, aluminum oxide, titanium oxide, and/or the like.

A plurality of color filters 291 to 293 may be formed on the first encapsulation layer 280. A first color filter 291 may be disposed in correspondence with the first subpixel P1, a second color filter 292 may be disposed in correspondence with the second subpixel P2, and a third color filter 293 may be disposed in correspondence with the third subpixel P3.

Due to a height of the pixel defining layer 270, each of the color filers 291 to 293 may be filled between adjacent pixel defining layers 270. Therefore, the light L that is totally reflected by the pixel defining layer 270 or is reflected by the second electrode 263 formed on the side surface of the pixel defining layer 270 may be output to the outside through each of the color filers 291 to 293. Accordingly, the loss of the light emitted from the light emitting layer 262 is reduced. Thus, emission efficiency increases.

Moreover, the color filters 291 to 293 may be disposed between the first encapsulation layer 280 and a second encapsulation layer 300, thereby reducing or preventing particles from penetrating into the light emitting layer 262 and the second electrode 263 via the first encapsulation layer 280. The second encapsulation layer 300 may be formed on the color filters 291 to 293. The second encapsulation layer 300 reduces or prevents penetration of oxygen or water. To this end, the second encapsulation layer 300 may include at least one inorganic layer. The inorganic layer may be formed of silicon nitride, aluminum nitride, zirconium nitride, titanium nitride, hafnium nitride, tantalum nitride, silicon oxide, aluminum oxide, titanium oxide, and/or the like.

Figure 9A:
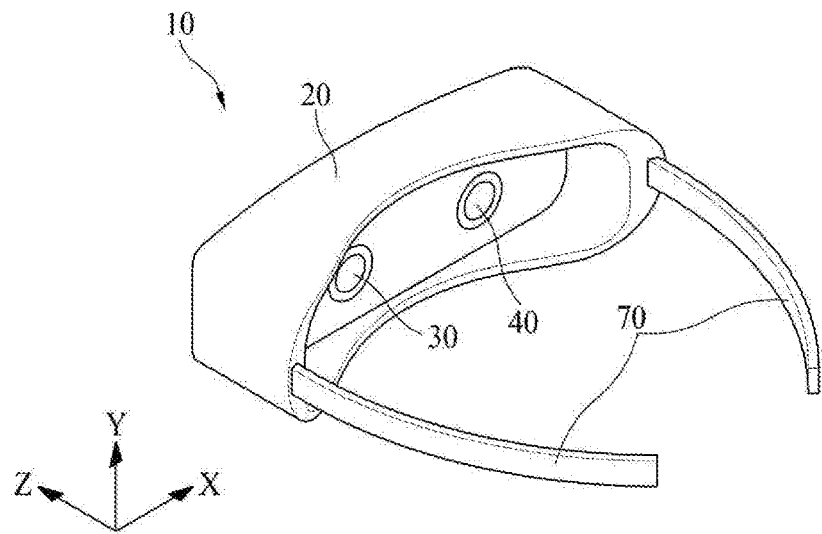
FIGS. 9A and 9B are perspective views illustrating a head-mounted display according to an example embodiment of the present disclosure.
Figure 9B:
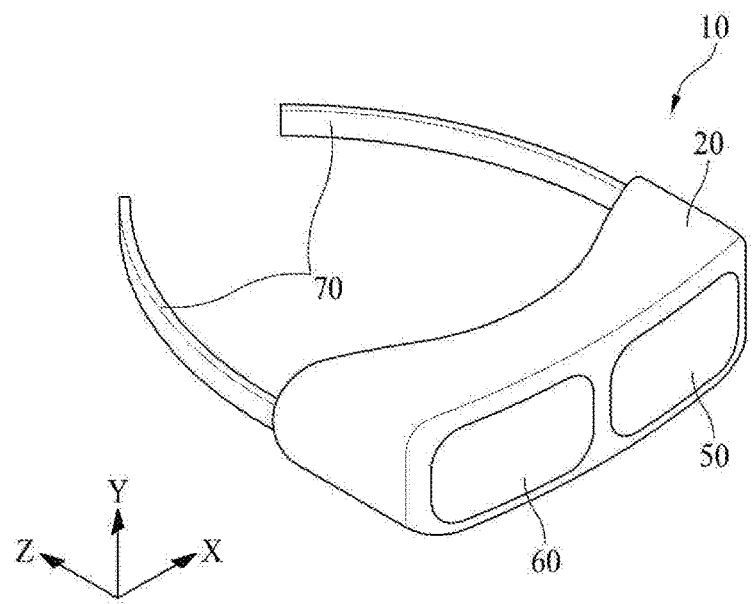

When the organic light emitting display device is applied to a head-mounted display (HMD) as shown in FIGS. 9A and 9B, the second encapsulation layer 300 may act as an upper substrate or an upper film. Thus, a separate substrate or film may not be attached on the second encapsulation layer 300. Moreover, when it is possible to sufficiently reduce or prevent penetration of oxygen or water using only the first encapsulation layer 280, the second encapsulation layer 300 may be provided to protect the color filters 291 to 293, and otherwise, may be omitted.

As described above, in an example embodiment of the present disclosure, the light emitted from the light emitting layer 262 may be totally reflected by the pixel defining layer 270 or may be reflected by the second electrode 263 formed on the side surface of the pixel defining layer 270. Therefore, in an example embodiment of the present disclosure, a problem in which light emitted from the light emitting layer 262 of one subpixel passes through the pixel defining layer 270 and is output through a color filter corresponding to a subpixel adjacent to the one subpixel is solved. Accordingly, according to an example embodiment of the present disclosure, the occurrence of color mixing is reduced.

Moreover, according to an example embodiment of the present disclosure, the light L that is totally reflected by the pixel defining layer 270 or is reflected by the second electrode 263 formed on the side surface of the pixel defining layer 270 may be output to the outside through the color filer. Accordingly, the loss of the light emitted from the light emitting layer 262 is reduced. That is, according to an example embodiment of the present disclosure, emission efficiency increases.

Figure 5:
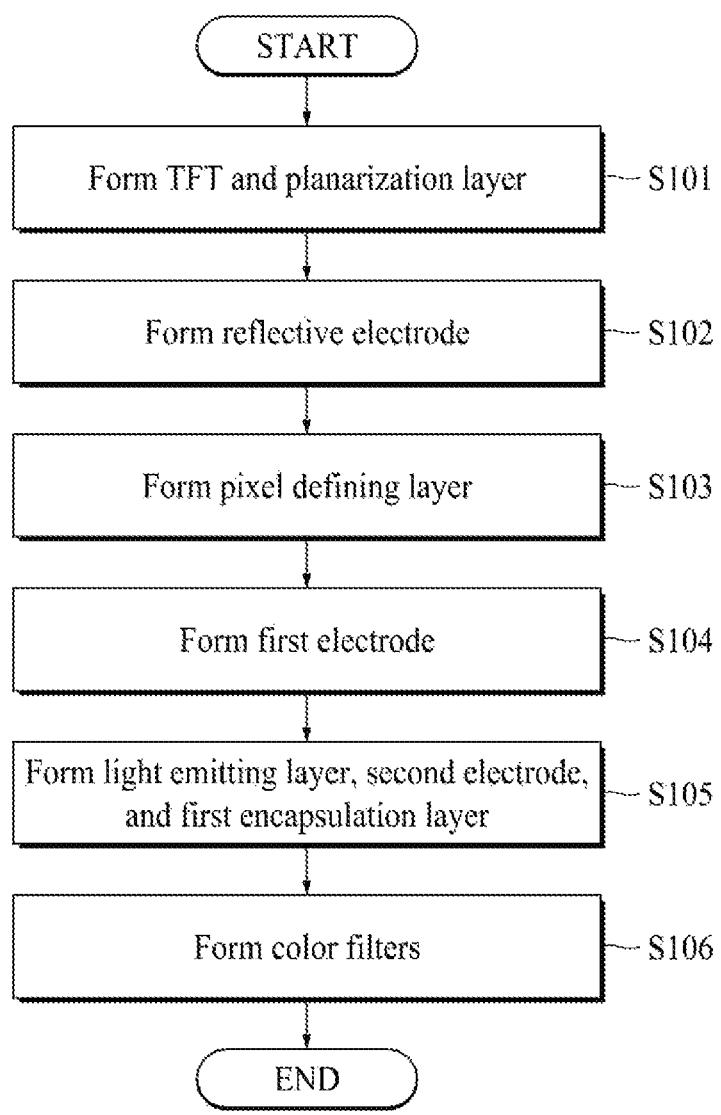
FIG. 5 is a flowchart illustrating a method of manufacturing an organic light emitting display device according to an example embodiment of the present disclosure.

FIG. 5 is a flowchart illustrating a method of manufacturing an organic light emitting display device according to an example embodiment of the present disclosure. FIGS. 6A to 6F are cross-sectional views illustrating a method of manufacturing an organic light emitting display device according to an example embodiment of the present disclosure, based on the flowchart of FIG. 5.

The cross-sectional views of FIGS. 6A to 6F relate to a method of manufacturing the organic light emitting display device illustrated in FIG. 4. Thus, like reference numerals refer to like elements. Hereinafter, a method of manufacturing an organic light emitting display device according to an example embodiment of the present disclosure will be described below with reference to FIGS. 6A to 6F.

Figure 6A:
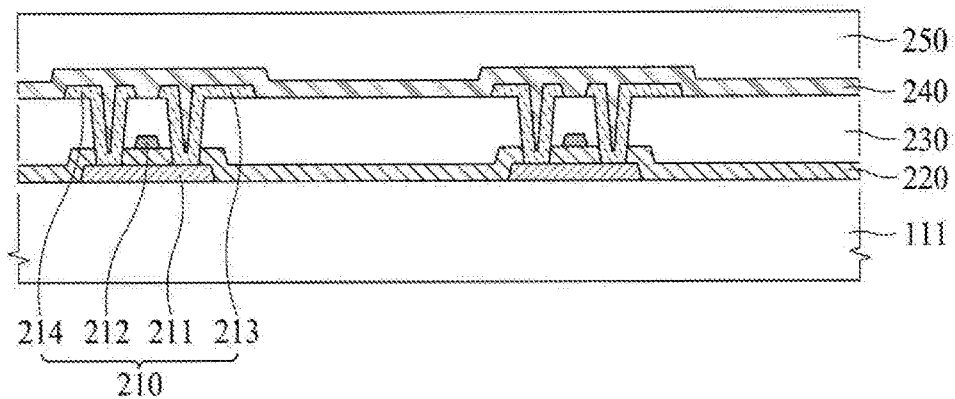
FIGS. 6A to 6F are cross-sectional views illustrating a method of manufacturing an organic light emitting display device according to an example embodiment of the present disclosure, based on the flowchart of FIG. 5.

First, as shown in FIG. 6A, a TFT 210 and a planarization layer 250 may be formed. For example, before the TFT 210 is formed, a buffer layer may be formed on a first substrate 111, for protecting the TFT 210 from water penetrating through a substrate 100. The buffer layer may include a plurality of inorganic layers that are alternately stacked, for protecting the TFT 210 and an organic light emitting device from water penetrating through the first substrate 111 vulnerable to penetration of water. For example, the buffer layer may be formed of a multilayer where one or more inorganic layers of silicon oxide ($SiO_x$), silicon nitride ($SiN_x$), and SiON are alternately stacked. The buffer layer may be formed using a chemical vapor deposition (CVD) process.

Subsequently, an active layer 211 of the TFT 210 may be formed on the buffer layer. Here, a semiconductor material layer may be formed all over the buffer layer using a sputtering process, a metal organic chemical vapor (MOCVD) process, and/or the like. Subsequently, the active layer 211 may be formed by patterning the semiconductor material layer through a mask process using a photoresist pattern. The active layer 211 may be formed of a silicon-based semiconductor material, an oxide-based semiconductor material, and/or the like.

Subsequently, a gate insulation layer 220 may be formed on the active layer 211. The gate insulation layer 220 may be formed of an inorganic layer, for example, silicon oxide (SiOx), silicon nitride (SiNx), or a multilayer thereof.

Subsequently, a gate electrode 212 of the TFT 210 may be formed on the gate insulation layer 220. Here, a first metal layer may be formed all over the gate insulation layer 220 using a sputtering process, an MOCVD process, and/or the like. Subsequently, the gate electrode 212 may be formed by patterning the first metal layer through a mask process using a photoresist pattern. The gate electrode 212 may be formed of a single layer or a multilayer including one of molybdenum (Mo), aluminum (Al), chromium (Cr), titanium (Ti), nickel (Ni), neodymium (Nd), and copper (Cu), or an alloy of one or more thereof.

Subsequently, an interlayer dielectric 230 may be formed on the gate electrode 212. The interlayer dielectric 230 may be formed of an inorganic layer, for example, SiOx, SiNx, or a multilayer thereof. Then, a plurality of contact holes passing through the gate insulation layer 220 and the interlayer dielectric 230 to expose the active layer 211 may be formed.

Subsequently, a source electrode 213 and a drain electrode 214 of the TFT 210 may be formed on the interlayer dielectric 230. Here, a second metal layer may be formed all over the interlayer dielectric 230 using a sputtering process, an MOCVD process, and/or the like. Subsequently, the source electrode 213 and the drain electrode 214 may be formed by patterning the second metal layer through a mask process using a photoresist pattern. Each of the source electrode 213 and the drain electrode 214 may contact the active layer 211 through a contact hole passing through the gate insulation layer 220 and the interlayer dielectric 230. The source electrode 213 and the drain electrode 214 may each be formed of a single layer or a multilayer including one of Mo, Al, Cr, Ti, Ni, Nd, Cu, or an alloy of one or more thereof.

Subsequently, a passivation layer 240 may be formed on the source electrode 213 and the drain electrode 214 of the TFT 210. The passivation layer 240 may be formed of an inorganic layer, for example, SiOx, SiNx, or a multilayer thereof. The passivation layer 240 may be formed using a CVD process.

Subsequently, a planarization layer 250 for planarizing a step height caused by the TFT 210 may be formed on the passivation layer 240. The planarization layer 250 may be formed of an organic layer such as acryl resin, epoxy resin, phenolic resin, polyamide resin, polyimide resin, and/or the like. (S101 of FIG. 5)

Figure 6B:
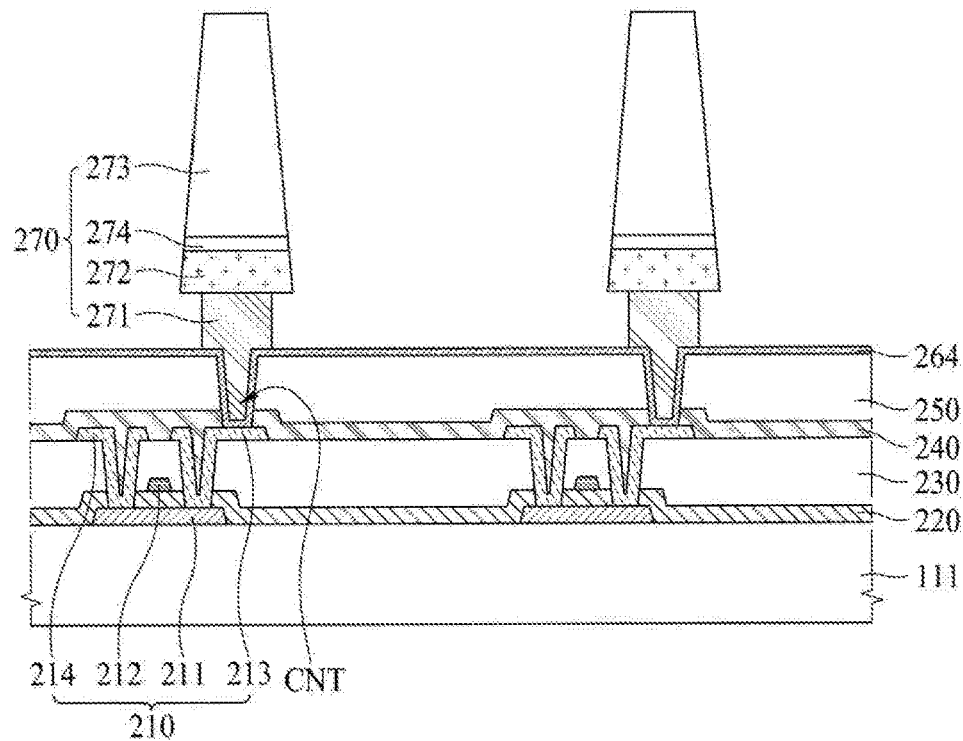

Second, as shown in FIG. 6B, an auxiliary electrode layer 264' may be formed on the planarization layer 250. Here, a contact hole CNT passing through the passivation layer 240 and the planarization layer 250 to expose the source electrode 213 or the drain electrode 214 of the TFT 210 may be formed.

Subsequently, the auxiliary electrode layer 264' may be formed on the planarization layer 250. The auxiliary electrode layer 264' may be connected to the source electrode 213 or the drain electrode 214 of the TFT 210. The auxiliary electrode layer 264' may be formed of a transparent conductive material, an opaque conductive material, or a semi-transmissive conductive material. The transparent conductive material may be a transparent conductive material (TCO), such as indium tin oxide (ITO) or indium zinc oxide (IZO). The semi-transmissive conductive material may include magnesium (Mg), silver (Ag), or an alloy of Mg and Ag. The opaque metal material may include aluminum (Al), molybdenum (Mo), a stacked structure (Mo/Ti) of Mo and titanium (Ti), copper (Cu), or a stacked structure (e.g., Ti/Al/Ti) of Al and Ti. (S102 of FIG. 5)

Figure 6C:
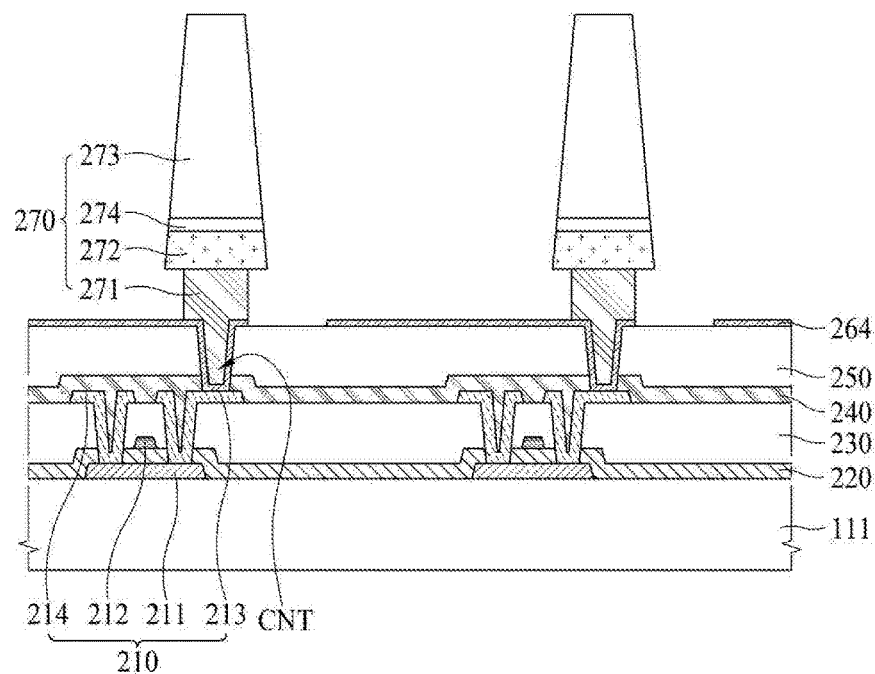

Third, as shown in FIG. 6C, a pixel defining layer 270 may be formed in the contact hole CNT. A first pixel defining layer 271, a second pixel defining layer 272, a first metal layer 274, and a third pixel defining layer 273 may be formed on the auxiliary electrode layer 264. A photoresist pattern for a halftone process may be formed on the third pixel defining layer 273. A thickness of the photoresist pattern in an area where the second pixel defining layer 272, the first metal layer 274, and the third pixel defining layer 273 are to be formed may be formed thicker than that of the photoresist pattern in the other area.

Subsequently, as shown in FIG. 8B, a hole H passing through the first pixel defining layer 271, the second pixel defining layer 272, the first metal layer 274, and the third pixel defining layer 273 uncovered by the photoresist pattern may be formed. Thus, the auxiliary electrode 264 may be patterned.

Subsequently, except the photoresist pattern in an area where the second pixel defining layer 272, the first metal layer 274, and the third pixel defining layer 273 are to be formed, the photoresist pattern in the other area may be formed by removing a portion of the photoresist pattern. Subsequently, the second pixel defining layer 272, the first metal layer 274, and the third pixel defining layer 273 may be formed by simultaneously forming the second pixel defining layer 272, the first metal layer 274, and the third pixel defining layer 273. Subsequently, the photoresist pattern remaining on the third pixel defining layer 273 may be removed. (S103 of FIG. 5)

Figure 6D:
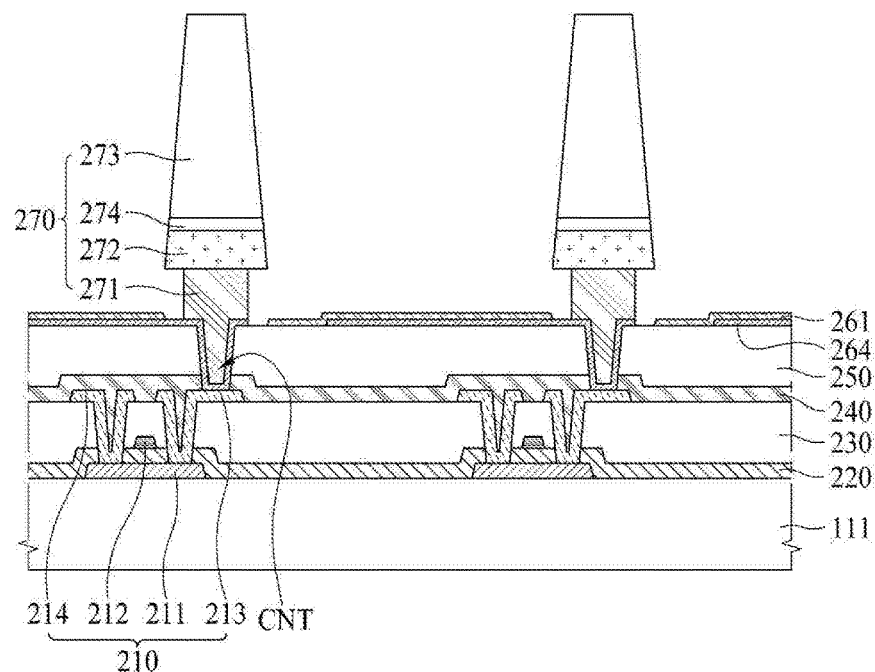

Fourth, as shown in FIG. 6D, a first electrode 261 may be formed on the auxiliary electrode 264. Here, using an MOCVD process or a sputtering process, the first electrode 261 may be formed on the auxiliary electrode 264 without a mask process using a photoresist pattern. Because the first electrode 261 is formed through a physical vapor deposition (PVD) process, such as a sputtering process, the first electrode 261 has good step coverage characteristics. In this case, when the first electrode 261 is formed using an evaporation deposition process in which a linearity of a depositing material is high, the first electrode 261 may be patterned in a shape that is disconnected in a boundary between the first pixel defining layer 271 and the second pixel defining layer 272.

Moreover, each of the subpixels P1 to P3 may be defined as an area where the first electrode 261, the light emitting layer 262, and the second electrode 263 are sequentially stacked to emit light, an area corresponding to each of the subpixels P1 to P3 may be defined by the first electrode 261. That is, a size of each of the subpixels P1 to P3 may be automatically determined along with forming the first electrode 261.

The first electrode 261 may include a first metal layer that is formed of a metal material with high reflectivity, such as Al, Ag, or an APC alloy, and a second metal layer that is formed of a transparent conductive material (TCO), such as ITO or IZO. Subsequently, the first electrode 261 formed on the pixel defining layer 270 may be removed. (S104 of FIG. 5)

Figure 6E:
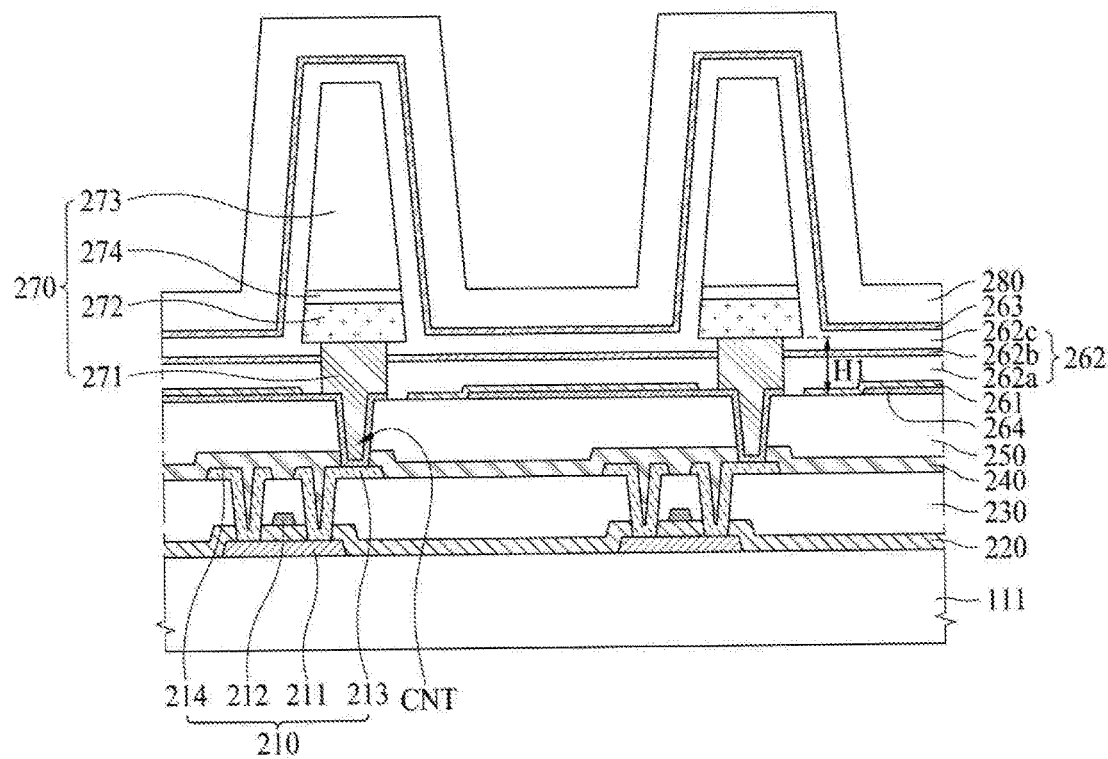

Fifth, as shown in FIG. 6E, a light emitting layer 262 and a second electrode may be formed on the first electrode 261. The light emitting layer 262 may be formed in a deposition process or a solution process. If the light emitting layer 262 is formed by a deposition process, the light emitting layer 262 may be formed by an evaporation process.

The light emitting layer 262 may be a common layer that is formed in the subpixels P1 to P3 in common, and may be a white light emitting layer to emit white light. In this case, the light emitting layer 262 may be formed in a tandem structure including two or more light emitting layers (or stacks). The light emitting layer 262, as shown in FIG. 4, may include a first light emitting layer 262a, a second light emitting layer 262c, and a charge generation layer 262b disposed between the first light emitting layer 262a and the second light emitting layer 262c. For example, to emit white light using a combination of the first light emitting layer 262a and the second light emitting layer 262c, the first light emitting layer 262a may include an organic light emitting layer that emits yellow light, and the second light emitting layer 262c may include an organic light emitting layer that emits blue light. However, embodiments of the present disclosure are not limited thereto.

Each of the first and second light emitting layers 262a and 262c may include a hole transporting layer, at least one light emitting layer, and an electron transporting layer. The hole transporting layer may smoothly transfer a hole, injected from the first electrode 261 or the charge generation layer, to the light emitting layer. The at least one light emitting layer may be formed of an organic material including a phosphorescent material or a fluorescent material, and thus, may emit a particular light. The electron transporting layer may smoothly transfer an electron, injected from the second electrode 263 or the charge generation layer, to the light emitting layer.

The charge generation layer 262b may include an n-type charge generation layer, disposed adjacent to a lower stack, and a p-type charge generation layer that is formed on the n-type charge generation layer and is disposed adjacent to an upper stack. The n-type charge generation layer may inject an electron into the lower stack, and the p-type charge generation layer may inject a hole into the upper stack. The n-type charge generation layer may be formed of an organic layer that is doped with an alkali metal, such as lithium (Li), sodium (Na), potassium (K), or cesium (Cs), or an alkaline earth metal, such as magnesium (Mg), strontium (Sr), barium (Ba), or radium (Ra). The p-type charge generation layer may be formed by doping a dopant on an organic material having an ability to transport holes.

An example embodiment of the present disclosure is not limited to that the light emitting layer 262 is provided as a common layer in the subpixels P1 to P3. In other example embodiments, the light emitting layer 262 may include a first organic light emitting layer that emits light of a first color in the first subpixel P1, a second organic light emitting layer that emits light of a second color in the second subpixel P2, and a third organic light emitting layer that emits light of a third color in the third subpixel P3. In this case, color filters may be omitted.

The light emitting layer 262 may be formed to cover the third pixel defining layer 273. A layer formed in an evaporation deposition process is not good in step coverage characteristic. Therefore, a thickness of the light emitting layer 262 formed on a side surface of the pixel defining layer 270 may be thinner than that of the light emitting layer 262 formed on the first electrode 261. Also, the charge generation layer 262b of the light emitting layer 262 may be disposed lower than a height H1 of the first pixel defining layer 271. The charge generation layer 262b formed on the first electrode 261 may be disconnected from the charge generation layer 262b formed on each of side surfaces of the second pixel defining layer 272. If the light emitting layer 262 is formed in the subpixels P1 to P3 in common, a current of one pixel can be leaked to an adjacent pixel through the charge generation layer 262b of the light emitting layer 262. However, according to an example embodiment of the present disclosure, the charge generation layer 262b of the light emitting layer 262 may be disposed lower than the height H1 of the first pixel defining layer 271. In an example embodiment of the present disclosure, because a width W2 of the second pixel defining layer 272 is set wider than a width W1 of the first pixel defining layer 271, the charge generation layer 262b of the light emitting layer 262 may be disconnectedly provided in a boundary between the first pixel defining layer 271 and the second pixel defining layer 272. Accordingly, in an example embodiment of the present disclosure, an adjacent pixel is prevented from being affected by a leakage current leaked through the charge generation layer 262b of the organic light emitting layer 262. Also, in an area other than the first electrode 261, the light emitting layer 262 is prevented from emitting light due to a leakage of a current.

Subsequently, a second electrode 263 may be formed on the light emitting layer 262. The second electrode 263 may be a common layer formed in the subpixels P1 to P3 in common. The second electrode 263 may be formed through a physical vapor deposition (PVD) process, such as a sputtering process. A layer formed in the PVD process such as the sputtering process has good step coverage characteristics. Therefore, the second electrode 263 may be formed to cover the third pixel defining layer 273 without being disconnected. The second electrode 263 may be formed of a transparent conductive material (TCO), such as ITO or IZO, or a semi-transmissive conductive material, such as Mg, Ag, or an alloy of Mg and Ag.

Subsequently, a first encapsulation layer 280 may be formed on the second electrode 263. The first encapsulation layer 280 reduces or prevents oxygen or water from penetrating into the light emitting layer 260 and the second electrode 263. To this end, the first encapsulation layer 280 may include at least one inorganic layer. The inorganic layer may be formed of silicon nitride, aluminum nitride, zirconium nitride, titanium nitride, hafnium nitride, tantalum nitride, silicon oxide, aluminum oxide, titanium oxide, and/or the like. (S105 of FIG. 5)

Figure 6F:
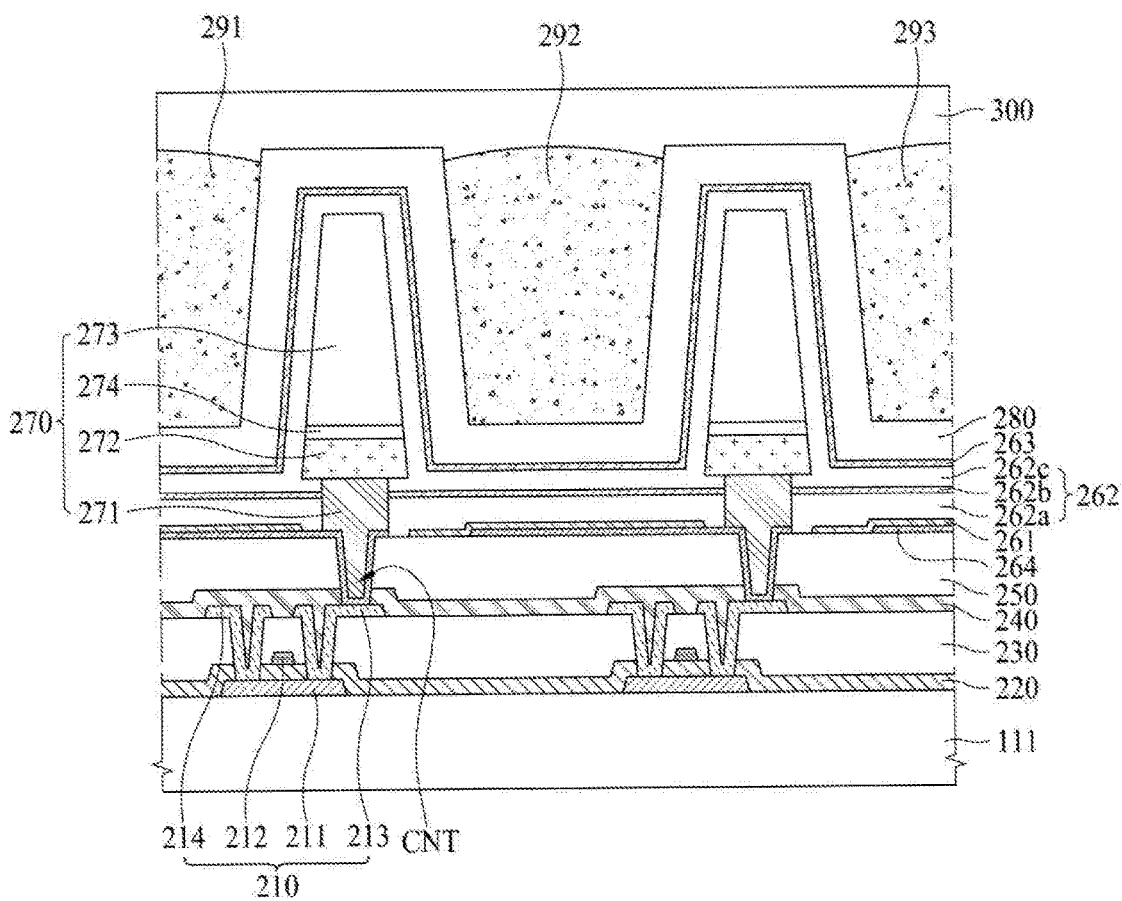

Sixth, as shown in FIG. 6F, a plurality of color filters 291 to 293 may be formed on the first encapsulation layer 280.

A first color filter 291 may be disposed in correspondence with the first subpixel P1, a second color filter 292 may be disposed in correspondence with the second subpixel P2, and a third color filter 293 may be disposed in correspondence with the third subpixel P3. The color filers 291 to 293 may be filled between adjacent pixel defining layers 270. Therefore, the color filters 291 to 293 may be disposed between the first encapsulation layer 280 and a second encapsulation layer 300, thereby reducing or preventing particles from penetrating into the light emitting layer 262 and the second electrode 263 via the first encapsulation layer 280.

Subsequently, the second encapsulation layer 300 may be formed on the color filters 291 to 293. The second encapsulation layer 300 reduces or prevents penetration of oxygen or water. To this end, the second encapsulation layer 300 may include at least one inorganic layer. The inorganic layer may be formed of silicon nitride, aluminum nitride, zirconium nitride, titanium nitride, hafnium nitride, tantalum nitride, silicon oxide, aluminum oxide, titanium oxide, and/or the like. When it is possible to reduce or prevent penetration of oxygen or water using only the first encapsulation layer 280, the second encapsulation layer 300 may be provided when it is desired to protect the color filters 291 to 293, and otherwise, may be omitted.

When the organic light emitting display device is applied to a head-mounted display (HMD), the second encapsulation layer 300 may act as an upper substrate or an upper film. Thus, a separate substrate or film may not be attached on the second encapsulation layer 300. (S106 of FIG. 5)

FIG. 7 is a cross-sectional view illustrating another example taken along line I-I' of FIG. 3.

Except for a second pixel defining layer 272, a first metal layer 274, and a third pixel defining layer 273 being formed in a vertical structure instead of a taper structure, an organic light emitting display device illustrated in FIG. 7 is substantially similar to the organic light emitting display device described above with reference to FIG. 4. Hereinafter, therefore, only the elements will be described in detail with reference to FIG. 7, and detailed descriptions of other elements are omitted.

With reference to FIG. 7, a light emitting layer 262 may be formed in a deposition process or a solution process. When the light emitting layer 262 is formed in the deposition process, the light emitting layer 262 may be formed in an evaporation deposition process. A layer formed using an evaporation deposition process does not have good step coverage characteristics. A second pixel defining layer 272, a first metal layer 274, and a third pixel defining layer 273 may be formed in a vertical structure. Thus, it is difficult for the light emitting layer 262 to be formed on a side surface of each of the second pixel defining layer 272, the first metal layer 274, and the third pixel defining layer 273.

However, the second electrode 263 may be formed through a physical vapor deposition (PVD) process, such as a sputtering process. A layer formed in the PVD process, such as the sputtering process, has good step coverage characteristics. Therefore, although the second pixel defining layer 272, the first metal layer 274, and the third pixel defining layer 273 are formed in the vertical structure, the second electrode 263 may be formed on the side surface of each of the second pixel defining layer 272, the first metal layer 274, and the third pixel defining layer 273. In this case, the second electrode 263 may contact the side surface of the first metal layer 274.

In an example embodiment of the present disclosure, the second electrode that is provided in plurality may contact the side surfaces of the first metal layer of the pixel defining layer. Thus, the second electrode 263 disposed on one side of the pixel defining layer 270 and the second electrode 263 disposed on the other side of the pixel defining layer 270 may be electrically connected to each other through the first metal layer 274. As a result, according to an example embodiment of the present disclosure, a current path of the second electrode 263 is reduced, thereby decreasing a resistance of each of the second electrodes 263.

Figure 8:
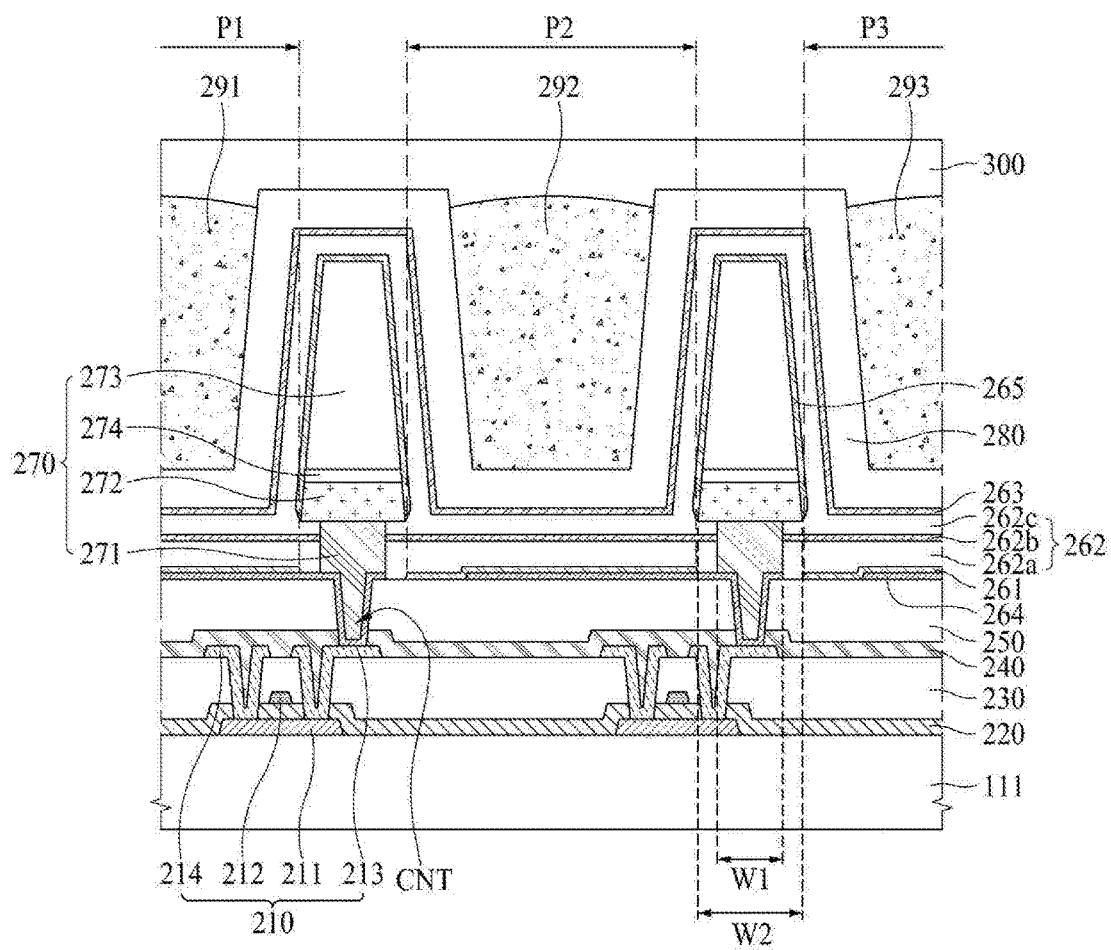
FIG. 8 is a cross-sectional view illustrating another example taken along line I-I' of FIG. 3.

FIG. 8 is a cross-sectional view illustrating another example taken along line I-I' of FIG. 3.

Except for a reflective metal layer 265 being formed on a side surface of a second pixel defining layer 272, a side surface of a first metal layer 274, and a side surface of a third pixel defining layer 273, an organic light emitting display device illustrated in FIG. 8 is substantially similar to the organic light emitting display device described above with reference to FIG. 4. Hereinafter, therefore, only the reflective metal layer 265 will be described in detail with reference to FIG. 8, and detailed descriptions of the other elements are omitted.

With reference to FIG. 8, a reflective metal layer 265 may be formed on a side surface of a second pixel defining layer 272, a side surface of a first metal layer 274, and a side surface of a third pixel defining layer 273. The reflective metal layer 265 may be formed of the same material as that of the first electrode 261. For example, the reflective metal layer 265 may include a first metal layer of a metal material with high reflectivity, such as Al, Ag, or an APC alloy, and a second metal layer of a transparent conductive material (TCO), such as ITO or IZO. Alternatively, the reflective metal layer 265 may include only the first metal layer of a metal material with high reflectivity, such as Al, Ag, or an APC alloy.

A height of the third pixel defining layer 273 may be set higher than that of each of the first pixel defining layer 271, the second pixel defining layer 272, and the first metal layer 274. Therefore, light emitted from a light emitting layer 262 may be reflected by the reflective metal layer 265 formed on a side surface of the third pixel defining layer 273. Accordingly, in an example embodiment of the present disclosure, the occurrence of color mixing is reduced. That is, the pixel defining layer 270 may act as a light separation wall for separating lights emitted from subpixels P1 to P3.

Moreover, light reflected by the reflective metal layer 265 may be output to the outside through a color filter. Thus, the loss of the light emitted from the light emitting layer 262 is reduced. That is, according to an example embodiment of the present disclosure, emission efficiency increases.

FIGS. 9A and 9B are perspective views illustrating a head-mounted display 10 according to an example embodiment of the present disclosure. FIG. 9A is illustrated in order for a rear surface of a display module accommodating unit 20 of the head-mounted display 10 to be shown, and FIG. 9B is illustrated in order for a front of the display module accommodating unit 20 of the head-mounted display 10 to be shown.

With reference to FIGS. 9A and 9B, the head-mounted display 10 according to an example embodiment of the present disclosure may include a display module accommodating unit 20, a first eyepiece lens 30, a second eyepiece lens 40, a first glass 50, a second glass 60, and glasses temples 70. The head-mounted display 10 according to an example embodiment of the present disclosure is illustrated as being implemented as a glasses type display including the glasses temples (arms) 70 for a user to easily wear or take off glasses as illustrated in FIGS. 9A and 9B, but is not limited thereto. That is, the head-mounted display 10 may include a head-mounted band capable of being worn on a head, instead of the glasses temples 70.

The display module accommodating unit 20 may include a display module, which displays an image, and an optical means for providing the image, displayed on the display module, to the first and second eyepieces lenses 30 and 40. The first and second eyepiece lenses 30 and 40 may be disposed on a rear surface of the display module accommodating unit 20. The first eyepiece lens 30 may be a left-eye lens where a left eye of a user is located, and the second eyepiece lens 40 may be a right-eye lens where a right eye of the user is located. Therefore, the user may watch an image displayed on the display module of the display module accommodating unit 20 through the first and second eyepiece lenses 30 and 40. Each of the first and second eyepiece lenses 30 and 40 may be implemented as a convex lens or a Fresnel lens, but embodiments are not limited thereto.

The first glass 50 and the second glass 60 may be disposed in front of the display module accommodating unit 20. The first glass 50 may be disposed in correspondence with the first eyepiece lens 30, and the second glass 60 may be disposed in correspondence with the second eyepiece lens 40. Therefore, the user may look at a foreground, seen through the first glass 50 and the second glass 60 using the first and second eyepieces lenses 30 and 40, in front of the display module accommodating unit 20. The first glass 50 and the second glass 60 may be designed to be closed or opened based on the desires of users. Alternatively, the first glass 50 and the second glass 60 may be omitted.

Figure 10:
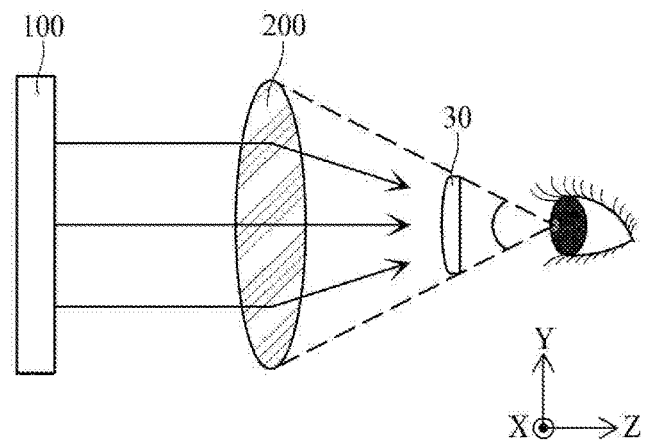
FIG. 10 is an example diagram illustrating an example of a display module accommodating unit of FIGS. 9A and 9B.

The display module accommodating unit 20 may include a display module 100 and a condensing lens 200 as shown in FIG. 10. The display module 100 may be a display device that displays an image, and for example, may be the organic light emitting display device described above with reference to FIGS. 1 to 8. Thus, a detailed description of the display module 100 is omitted.

The condensing lens 200 may be disposed between the display module 100 and the first eyepiece lens 30. The condensing lens 200 may provide an image, displayed on the display module 100, to the first eyepiece lens 30. The first eyepiece lens 30 may be implemented as a convex lens or a Fresnel lens, but embodiments are not limited thereto. Depending on the situation, the condensing lens 200 may be omitted.

That is, in an example embodiment of the present disclosure, as shown in FIG. 9A, a virtual image displayed by the display module of the display module accommodating unit 20 may be provided to eyes of a user through the first eyepiece lens 30. As a result, in an example embodiment of the present disclosure, virtual reality (VR) is realized.

Figure 11:
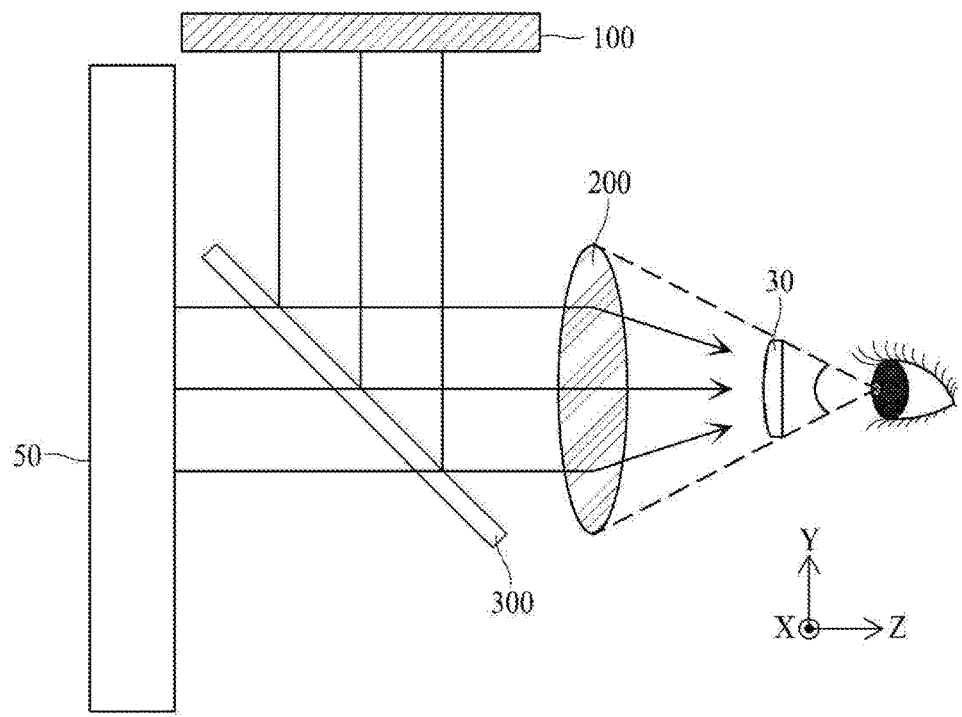
FIG. 11 is an example diagram illustrating another example of a display module accommodating unit of FIGS. 9A and 9B.

Alternatively, as shown in FIG. 11, the display module accommodating unit 20 may include the display module 100, the condensing lens 200, and a transmissive reflector 300. The display module 100 may be disposed over the transmissive reflector 300. The display module 100 may be a display device that displays an image, and for example, may be the organic light emitting display device described above with reference to FIGS. 1 to 8. Thus, a detailed description of the display module 100 is omitted.

The condensing lens 200 may be disposed between the transmissive reflector 300 and the first eyepiece lens 30. The condensing lens 200 may provide an image, displayed on the display module 100 and reflected by the transmissive reflector 300, to the first eyepiece lens 30. The condensing lens 200 may be implemented as a convex lens or a Fresnel lens, but is not limited thereto. Depending on the situation, the condensing lens 200 may be omitted.

The transmissive reflector 300 may be disposed between the condensing lens 200 and the first glass 50. The transmissive reflector 300 may be a reflective polarizer or a half mirror that transmits some light and reflects other light. The half mirror may include glass and a semi-transmissive conductive layer provided on one surface of the glass. The semi-transmissive conductive layer may be formed of a semi-transmissive conductive material, such as Mg, Ag, or an alloy of Mg and Ag. The reflective polarizer may be an advanced polarizing film (APF) or a dual bright enhanced film (DBEF), but embodiments are not limited thereto.

That is, in an example embodiment of the present disclosure, because the transmissive reflector 300 that transmits some light and reflects other light is provided, the transmissive reflector 300 may transmit light incident from the first glass 50 and may provide an image, displayed on the display module 100, to the condensing lens 200. Therefore, a user can watch all of a scene, seen through the first glass 50 using the first eyepiece lens 30, and the image displayed on the display module 100. That is, the user can watch one image obtained by overlapping a scene of reality and a virtual image. Thus, augmented reality (AR) is realized. The display module accommodating unit 20 is not limited to the illustration of FIG. 11, and according to an example embodiment of the present disclosure, AR may be realized using various optical structures.

As described above, the organic light emitting display device according to an example embodiment of the present disclosure may be applied to a head-mounted display. In this case, the second encapsulation layer 300 provided on the color filters may act as an upper substrate or an upper film. Thus, a separate substrate or film may not be attached on the second encapsulation layer 300.

As described above, according to example embodiments of the present disclosure, light emitted from the light emitting layer may be totally reflected by the pixel defining layer or may be reflected by the reflective electrode or the second electrode provided on a side surface of the pixel defining layer. Therefore, according to example embodiments of the present disclosure, a problem in which light emitted from a light emitting layer of one subpixel passes through the pixel defining layer and is output through a color filter corresponding to a subpixel adjacent to the one subpixel can be reduced or solved. Accordingly, according to example embodiments of the present disclosure, the occurrence of color mixing is reduced.

Moreover, according to example embodiments of the present disclosure, light reflected by the pixel defining layer, the second electrode, or the reflective electrode can be output to the outside through a color filter, thereby decreasing the loss of light emitted from the light emitting layer. That is, according to example embodiments of the present disclosure, emission efficiency increases.

Moreover, according to example embodiments of the present disclosure, the second electrodes may contact the side surfaces of the first metal layer of the pixel defining layer. Thus, the second electrode disposed on one side of the pixel defining layer and the second electrode disposed on the other side of the pixel defining layer may be electrically connected to each other through the first metal layer. As a result, according to example embodiments of the present disclosure, a current path of the second electrode is reduced, thereby decreasing a resistance of the second electrode.

Moreover, example embodiments of the present disclosure may be applied to heat-mounted displays. In this case, the second encapsulation layer provided on the color filters may act as the upper substrate or the upper film. Thus, a separate substrate or film may not be attached on the second encapsulation layer.

It will be apparent to those skilled in the art that various modifications and variations can be made in the organic light emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device, comprising:
    a first electrode in an emission area of a subpixel;
    a pixel defining layer surrounding the first electrode in a non-emissive area of the subpixel;
    a light emitting layer on the first electrode;
    a second electrode on the light emitting layer;
    a first encapsulation layer on the second electrode; and
    a color filter on the first encapsulation layer in the subpixel,
    wherein the pixel defining layer includes:

a first pixel defining layer;

a second pixel defining layer on the first pixel defining layer, a width of the second pixel defining layer at any height thereof is wider than a width of the first pixel defining layer at any height thereof;

a first metal layer on the second pixel defining layer; and a third pixel defining layer on the first metal layer;

wherein a thickness of the third pixel defining layer is thicker than a thickness of each of the first pixel defining layer, the second pixel defining layer, and the first metal layer.

2. The organic light emitting display device of claim 1, wherein the light emitting layer includes:

a first organic light emitting layer on the first electrode;

a charge generation layer on the first organic light emitting layer; and a second organic light emitting layer on the charge generation layer, wherein a height of the charge generation layer is lower than a height of the first pixel defining layer.

3. The organic light emitting display device of claim 2, wherein the second organic light emitting layer, the second electrode, and the first encapsulation layer are sequentially disposed on the third pixel defining layer.

4. The organic light emitting display device of claim 3, wherein the second electrode includes a transparent conductive material, and wherein a refractive index of each of the first to third pixel defining layers is lower than a refractive index of the light emitting layer, a refractive index of the second electrode, a refractive index of the first encapsulation layer, and a refractive index of the color filter.

5. The organic light emitting display device of claim 3, wherein the second electrode includes a semi-transmissive conductive material.

6. The organic light emitting display device of claim 3, wherein a voltage is not applied to the first metal layer.

7. The organic light emitting display device of claim 2, wherein the second electrode contacts a side surface of the first metal layer.

8. The organic light emitting display device of claim 2, further comprising a reflective metal layer covering the second and third pixel defining layers, wherein the reflective metal layer contacts a side surface of the first metal layer.

9. The organic light emitting display device of claim 8, wherein the second organic light emitting layer, the second electrode, and the first encapsulation layer are sequentially disposed on the reflective metal layer.

10. The organic light emitting display device of claim 9, wherein the second electrode includes at least one of a transparent conductive material and a semi-transmissive conductive material.

11. The organic light emitting display device of claim 1, further comprising a second encapsulation layer on the color filter, wherein each of the first and second encapsulation layers includes at least one inorganic layer.

12. The organic light emitting display device of claim 1, wherein the light emitting layer is on the pixel defining layer.

13. The organic light emitting display device of claim 1, wherein the pixel defining layer does not extend over the emission area of the subpixel.

14. The organic light emitting display device of claim 1, wherein the second electrode is formed over top and side surfaces of the pixel defining layer.

15. The organic light emitting display device of claim 1, wherein the color filter has an upper surface higher than an upper surface of the pixel defining layer.

16. The organic light emitting display device of claim 1, wherein the color filter has an upper surface higher than an upper surface of the third pixel defining layer.

17. The organic light emitting display device of claim 1, wherein a width the third pixel defining layer at any height thereof is narrower than the width of the second pixel defining layer at any height thereof.

18. The organic light emitting display device of claim 1, wherein the pixel defining layer does not cover the first electrode with respect to a plan view.

19. The organic light emitting display device of claim 1, wherein a width of the second pixel defining layer at an interface between the first and the second pixel defining layers is wider than a width of the first pixel defining layer at the interface between the first and the second defining layers.

20. An organic light emitting display device, comprising:

a first electrode in an emission area of a subpixel;

a pixel defining layer surrounding the first electrode in a non-emissive area of the subpixel;

a light emitting layer on the first electrode;

a second electrode on the light emitting layer;

a first encapsulation layer on the second electrode; and a color filter on the first encapsulation layer in the subpixel, wherein the pixel defining layer includes:

a first pixel defining layer;

a second pixel defining layer on the first pixel defining layer, the second pixel defining layer having a width wider than a width of the first pixel defining layer;

a first metal layer on the second pixel defining layer; and a third pixel defining layer on the first metal layer wherein the color filter is in the emission area surrounded by the pixel defining layer such that an upper surface of the color filter is higher than an upper surface of the third pixel defining layer, wherein a thickness of the third pixel defining layer is thicker than a thickness of each of the first pixel defining layer, the second pixel defining layer, and the first metal layer.

21. The organic light emitting display device of claim 20, wherein the color filter is in the emission area surrounded by the first encapsulation layer.

22. The organic light emitting display device of claim 21, further comprising a second encapsulation layer on the color filter, wherein the color filter layer is between the first encapsulation layer and the second encapsulation layer.

* * * * *